(12) United States Patent
Parrassin

(10) Patent No.: US 7,026,198 B2
(45) Date of Patent: Apr. 11, 2006

(54) FOCUSED ION BEAM TREATMENT METHOD AND SEMICONDUCTOR DEVICE SUITABLE FOR ITS IMPLEMENTATION

(75) Inventor: Thierry Parrassin, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/782,724

(22) Filed: Feb. 19, 2004

(65) Prior Publication Data

US 2004/0266072 A1 Dec. 30, 2004

(30) Foreign Application Priority Data

Feb. 19, 2003 (FR) .................................. 03 02008

(51) Int. Cl.
*H01L 21/00* (2006.01)
*H01L 21/322* (2006.01)

(52) U.S. Cl. ...................... 438/155; 438/474; 438/479; 438/798

(58) Field of Classification Search ................ 438/149, 438/155, 474, 479, 798
See application file for complete search history.

(56) References Cited

U.S. PATENT DOCUMENTS

| 6,121,668 A | 9/2000 | Soderbarg et al. |
| 6,245,600 B1 | 6/2001 | Geissler et al. |
| 6,413,857 B1 | 7/2002 | Subramanian et al. |
| 2002/0132395 A1 | 9/2002 | Iyer et al. |

OTHER PUBLICATIONS

French Preliminary Search Report dated Nov. 17, 2003 for French Application No. 03 02008.

*Primary Examiner*—Hsien-ming Lee
(74) *Attorney, Agent, or Firm*—Lisa K. Jorgenson; Jon A. Gibbons; Fleit, Kain, Gibbons, Gutman, Bongini & Bianco P.L.

(57) ABSTRACT

A buried oxide layer of an SOI substrate beneath a structure electrically isolated from the rest of a semiconductor device is made to break down so as to open a bias path for the substrate through the structure. It then suffices to connect the electrical ground of the semiconductor device to this bias path so that the ions flow away into the substrate during a focused ion beam treatment of the semiconductor device.

12 Claims, 3 Drawing Sheets

FOCUSED ION BEAM TREATMENT METHOD AND SEMICONDUCTOR DEVICE SUITABLE FOR ITS IMPLEMENTATION

CROSS-REFERENCE TO RELATED APPLICATIONS

This application is based upon and claims priority from prior French Patent Application No. 03 02008, filed on Feb. 19, 2003 the entire disclosure of which is herein incorporated by reference.

1. Field of the Invention

The present invention generally relates to a method of treating a semiconductor device, and more specifically to a method of treating a semiconductor device produced on the surface of a silicon-on-insulator substrate, with a focused ion beam.

2. Background of the Invention

The treatment with a focused ion beam (FIB) is well known for the production of test chips in the field of research and development in microelectronics. Depending on the nature of the gas formulation used in combination with the focused ion beam, such a treatment allows local cutting or deposition of a metallic material or of a dielectric in a semiconductor device produced on the surface of a substrate. Such cutting and such deposition make it possible in particular to repair the device without having to produce a new chip. This makes it possible to reduce both the fabrication time and fabrication cost of semiconductor devices in the research and development phase.

Such chips are typically portions of a wafer that are in general not cut and are not packaged. Consequently, the electrical ground of the corresponding semiconductor device is not connected to the electrical ground of an integrated circuit.

The ions must be removed from the wafer. In the case of a device produced directly on a bulk-doped silicon substrate, the ions flow away through the substrate, which is generally connected to the electrical ground of the FIB machine. It is said that the substrate becomes biased.

However, in the case of a semiconductor device produced on the surface of a silicon-on-insulator (SOI) substrate, the buried oxide (BOX) layer prevents the ions from flowing away into the substrate. Consequently, the substrate is no longer biased. The device has two electrical grounds that are isolated from each other, namely the ground for the substrate and the ground for the semiconductor device.

Nevertheless, it may happen that an electrostatic discharge (ESD) through certain layers of materials forming the semiconductor device occurs. If such a discharge occurs through the BOX layer, this layer may be destroyed locally by a phenomenon identical to the breakdown of a capacitor. Thus, the advantage of the isolation of the semiconductor device relative to the substrate is lost locally, but this is a limited drawback. A much more serious drawback is encountered when the electrostatic discharge occurs through the gate of a MOS transistor of the device. This is because, since the gate has therefore broken down, the MOS transistor is destroyed, which may affect the operation of the device.

It would be conceivable to create, during fabrication of the device, a bias path from the substrate through the buried oxide layer in order to allow the ions to flow away into the substrate during the FIB treatment. However, this is not possible since the fabrication processes currently available in the microelectronics field provide no mask for the buried oxide layer.

Accordingly, a need exists to solve the aforementioned problem of the prior art and to provide a method a focused ion beam method to reduce the damage caused by electrostatic discharge through certain layers forming the semiconductor device.

SUMMARY OF THE INVENTION

The present invention overcomes the electrostatic discharge problems with the prior art by teaching a method of making a BOX layer beneath a structure electrically isolated from the rest of the circuit break down a posteriori (that is to say after fabrication of the device) so as to open a bias path from the substrate through the structure. It is then sufficient to connect the (floating) electrical ground of the semiconductor to be treated by FIB to this bias path so that the ions flow away into the substrate during this treatment.

Thus, a first aspect of the invention relates to a method of treating a semiconductor device with a focused ion beam, the device being produced on the surface of an SOI substrate and comprising an interconnect structure having a first defined metal line that is electrically connected to the electrical ground of the semiconductor device. The method comprises the steps consisting in:

causing the insulator layer of the substrate, beneath an active zone of a structure electrically isolated from the rest of the semiconductor device and electrically connecting the active zone to a second defined metal line, to break down by subjecting the second metal line to a focused ion beam until breakdown of the insulator layer;

creating an electrical connection between the first metal line and the second metal line;

treating the semiconductor device by FIB; and breaking the electrical connection between the first metal line and the second metal line.

A second aspect of the invention relates to a semiconductor device produced on the surface of an SOI substrate, suitable for implementing the method according to the first aspect. This device is, for example, a test chip, especially one in a research and development phase. This device comprises:

at least one active zone and an interconnect structure having a first defined metal line that is electrically connected to the electrical ground of the semiconductor device; and furthermore a structure electrically isolated from the rest of the semiconductor device, that comprises an active zone covering the insulator layer of the substrate and an interconnect structure connected to the active zone and having a second defined metal line.

The minimum distance (in a direction parallel to the surface of the substrate) between the active zone of the isolated structure and any other active zone of the rest of the device, is greater than the thickness (in a direction perpendicular to the surface of the substrate) of the insulator layer of the substrate. Furthermore, the minimum distance (in a direction parallel to the surface of the substrate) between the elements of the interconnect structure of the isolated structure and the elements of the interconnect structure of the rest of the device, is greater than the thickness of the insulator layer of the substrate (in the direction perpendicular to the surface of the substrate). This ensures that the insulator layer of the substrate breaks down before breakdown of another portion of insulator surrounding the isolated structure when the method according to the first aspect is implemented.

Preferably, the first metal line and the second metal line belong to the metallization level of the semiconductor device that is furthest away from the substrate. It is thus easier to create an electrical connection between the lines by depositing a metal bridge.

BRIEF DESCRIPTION OF THE DRAWINGS

The subject matter, which is regarded as the invention, is particularly pointed out and distinctly claimed in the claims at the conclusion of the specification. The foregoing and other features, and advantages of the invention will be apparent from the following detailed description taken in conjunction with the accompanying drawings in which:

DESCRIPTION OF THE PREFERRED EMBODIMENTS

Figure 1:
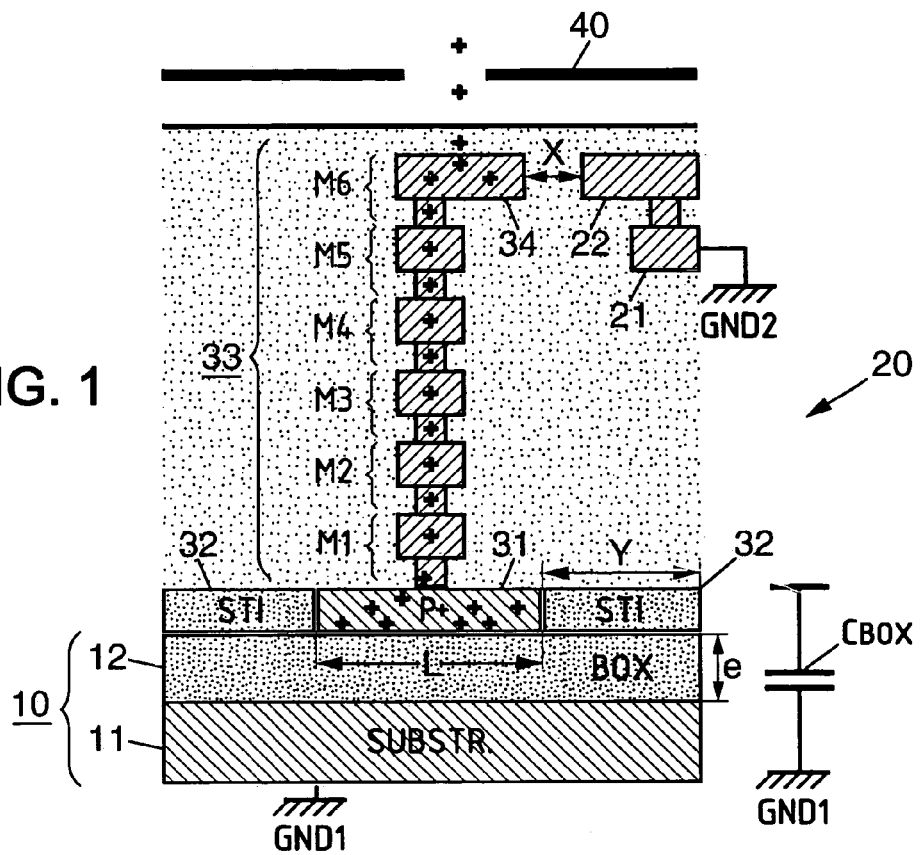
FIG. 1 is a partial sectional view of a semiconductor device, including a passivation layer, at the start of a method according to the present invention.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality.

In the drawings, the same elements bear identical references. We consider the example of a technology in which the interconnects are produced on six superposed metallization levels, M1 to M6 respectively, using the damascene technique or the dual damascene technique. In addition, the metallization level M6 which is furthest away from the substrate 10 is covered with an insulating layer called a passivation layer.

Moreover, we consider the example of FIB treatments by means of positive ions, such as positively ionized argon (Ar) atoms.

FIG. 1 shows a partial sectional view of a semiconductor device 20 at the start of the method according to the invention. It is assumed that such a device has been fabricated beforehand using the conventional microelectronics techniques.

The device 20 is produced on the surface of a substrate 10 which is an SOI substrate comprising a layer 11 of a semiconductor material, for example lightly doped silicon, covered with a thin layer of buried oxide, for example silicon dioxide ($SiO_2$). This thickness e of the layer 11 is, for example, around 500 μm ($10^{-6}$ metres) and the thickness of the layer 12 is, for example, around 500 nm ($10^{-9}$ metres).

These thicknesses are taken in a direction perpendicular to the surface of the substrate. Such an SOI substrate is available, for example, from the company SOITEC.

Any semiconductor device 20 whatsoever is produced on the surface of the substrate 10. This device comprises one or more active zones and an interconnect structure. The term "active zone" is understood within the context of the present invention to mean a zone of non-insulating material, not belonging to the interconnect structure. Typically, this is a zone of n-doped or p-doped silicon, that may be involved in the construction of components such as MOS transistors or the like.

In the figures, only part of the device 20 is shown, especially two metal lines 21 and 22 produced in the respective metallization levels M5 and M6 of its interconnect structure. It will be assumed that these lines, that are connected together by a vertical interconnect (via), are connected to the ground GND2 of the device 20. It should be noted that the lines 21 and 22 are surrounded by a dielectric, for example $SiO_2$, and that the line 22 is also covered with a thin layer of dielectric, for example $SiO_2$ or silicon nitride ($Si_3N_4$) acting as passivation layer.

According to the invention, the device 20 furthermore includes an isolated structure 30. The term "isolated structure" is understood to mean a structure electrically isolated from the rest of the device 20. This structure has the function, after FIB treatment, of forming a conducting path, called a bias path, from the substrate 10 in order to remove the ions during an FIB treatment of the rest of the device.

The isolated structure 30 includes an active zone 31 lying on the surface of the substrate 10, on top of (and preferably covering) the insulator layer 12, being also surrounded by an insulator 32 (Shallow Trench Insulator or STI). The thickness of the active zone 31 and of the insulator 32 is, for example, approximately equal to 140 nm. The zone 31 is obtained by deposition using the techniques for deposition on an SOI substrate. The zone may be made of positively doped silicon, for example silicon doped with boron atoms. The active zone 31 may also be made of negatively doped silicon, for example silicon doped with phosphorus atoms. In fact, it is advantageous for it to be positively doped when the ions of the focused ion beam used for the treatment are positive ions (as in the example considered here) and for it to be negatively doped when these ions are negative ions. This makes the breakdown of the insulator layer 12 easier to achieve (see below).

Advantageously, the distance Y between the active zone 31 and the other active zones (not shown) of the device 20, the distance being taken along a direction parallel to the surface of the substrate 20, is greater than the thickness e of the oxide layer 12. In this way, the breakdown of the layer 12 takes place before that of the insulator 32.

The isolated structure 30 also includes an interconnect structure 33 that comprises a metal line 34 in the metallization level M6. The structure 33 forms a conducting path extending between the active zone 31 and the metal line 34, said structure being isolated from the rest of the device as it is surrounded by a dielectric. The simplest example of the structure 33 is a stack of metal forming a column of alternately superposed lines and vias. For each of the metallization levels M1 to M6, the interconnect structure 33 thus comprises a line portion (horizontal connection) such as the line 34, and a via (vertical connection), these lines and these vias being shown conventionally in the figures.

Initially (that is to say after fabrication of the device but before its FIB treatment), the isolated structure 30 forms a simple conducting path between the active zone 31 and the metal line 34. It may be made at the same time as the rest of the device 20. In particular, the interconnect structure 33 may result from the photolithography and deposition steps employed for producing the interconnect structure of the rest of the circuit (comprising in particular the lines 21 and 22). The isolated structure therefore incurs no prohibitive cost-up.

The surface of the active zone 31 determines the value of an equivalent capacitor $C_{BOX}$ between the active zone 31 and the layer 11, these being separated by the insulator layer 12. The greater L, the higher the value of $C_{BOX}$. To facilitate the breakdown of the capacitor $C_{BOX}$ (see below), the dimensions of the active zone 31 in a direction parallel to the surface of the substrate are as small as possible. The active zone 31 is, for example, a square having sides of length L. In practice, the value of L is limited by the design rules of the technology used. At the present time, these rules make it possible to go down to a minimum of L=0.13 µm. Preferably, L does not exceed a maximum length that may be set at 10 times the above minimum value, that is to say 1.3 µm. Typically, L is equal to about 1 µm.

FIG. 1 also illustrates a step of FIB treatment of the portion of the passivation layer to the right of the metal layer 34. This treatment takes place through a depassivation mask 40 that has an aperture in line with the line portion 34. The purpose of the treatment is to remove the passivation layer in the window so as to at least partly expose the metal line 34. The ions used cannot flow away into the substrate 10 because of the buried oxide layer 12. This is why these ions charge the active zone 31, in fact the capacitor $C_{BOX}$. As they are positive ions in the example, they are shown in the figures by "+" signs in the various elements of the isolated structure.

Figure 2:
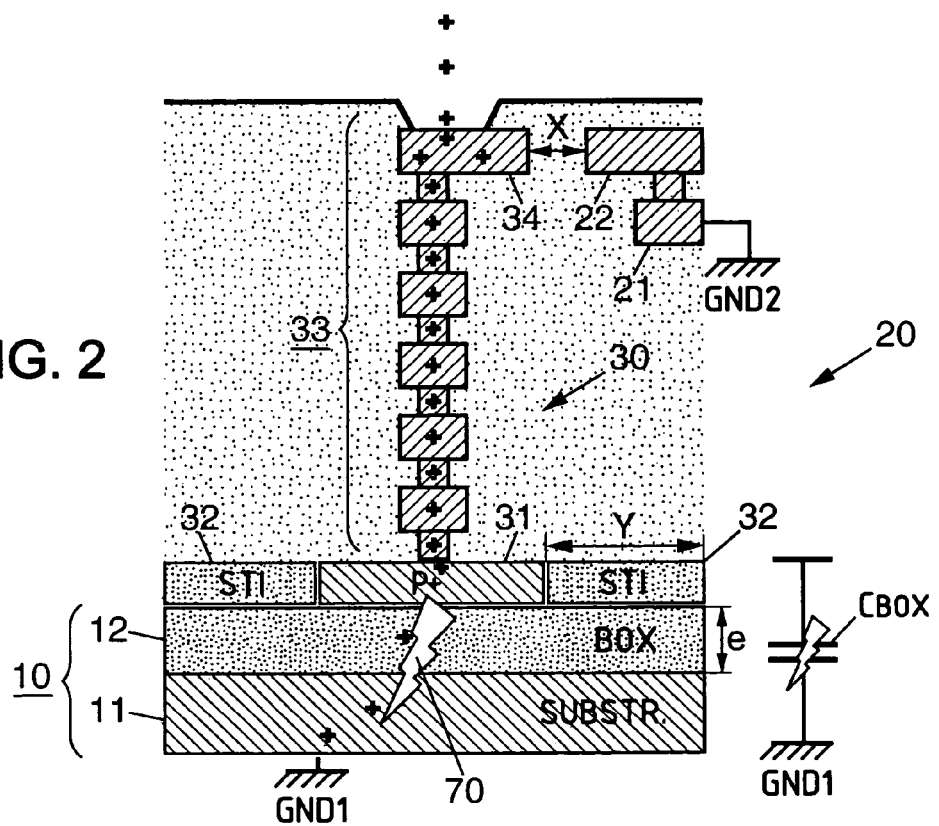
FIG. 2 is a partial sectional view of the semiconductor device after an entire thickness of the passivation layer over a metal line has been removed.

When the entire thickness of the passivation layer has been removed, the configuration shown schematically in FIG. 2 is obtained. By continuing the FIB treatment (or by applying another FIB treatment, but preferably with ions of the same polarity), with or without the depassivation mask 40, the charging of the active zone 31 continues to increase.

Preferably, the polarity (i.e. the positive or negative sign) of the ions of the FIB treatment is identical to the polarity of the doping in the active zone of the isolated structure (the expression "polarity of the doping" is understood to mean positive polarity in the case of p doping and negative polarity in the case of n doping).

The charging of the active zone 31 increases up the point when the voltage across the terminals of the capacitor $C_{BOX}$ exceeds the breakdown voltage of this capacitor. The insulator layer 12 is then destroyed locally above the active zone 31. This breakdown is shown symbolically in FIG. 2 by an arrow 70. A similar arrow is also shown on the symbol for the capacitor $C_{BOX}$ and can be seen on the bottom right-hand side of FIG. 2.

The ions then flow away from the active zone 31 into the layer 11 of the substrate 10. The substrate 10 is then said to be biased. In operation, the layer 11 of the substrate 10 is connected to the ground GND1 of the equipment used for carrying out the FIB treatment. The ions therefore flow away to ground (GND1).

In this state, the isolated structure 30 forms an ion flow path from the metal line 34 to the layer 11 of the substrate 10, or the bias path for the substrate 10.

It should be noted that the distance X between the metal lines 22 and 24, and more generally the minimum distance between the elements of the interconnect structure 33 and those of the interconnect structure from the rest of the circuit, taken along a line parallel to the surface of the substrate 10, is preferably greater than the thickness e of the insulator layer 12. Likewise, the distance Y, taken along a line parallel to the surface of the substrate 10 between the active zone 31 and any other active zone of the device, is greater than the thickness e. Thus, the breakdown of the insulator that surrounds the isolated structure 30 does indeed occur within the layer 12, and not elsewhere. Preferably, the aforementioned distances X and Y are not less than 1 µm.

Figure 3:
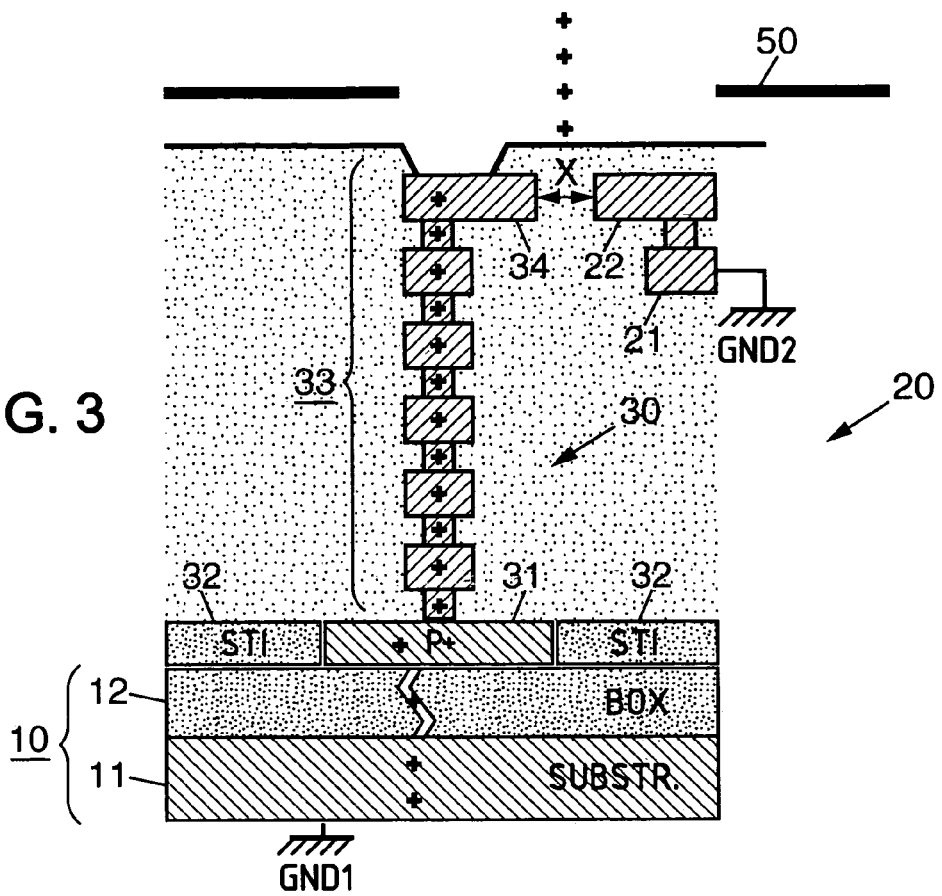
FIG. 3 is a partial sectional view of the semiconductor device prior to a FIB treatment step intended to remove the passivation layer over another metal line.

The diagram in FIG. 3 illustrates an FIB treatment step intended to remove a passivation layer on top of the metal line 22 belonging to the rest of the device 20. This step may also be carried out by means of an FIB treatment through a depassivation mask 50 having a suitable aperture. Advantageously, this aperture exposes not only the passivation layer on top of at least part of the metal line 22, but also at least an exposed part of the metal line 34 of the isolated structure 30. In this way, the ions can flow away into the substrate 10 via the bias path open through the isolated structure 30 and the buried oxide layer 12. Thus, there is no risk of the rest of the device being damaged by this FIB treatment.

Figure 4:
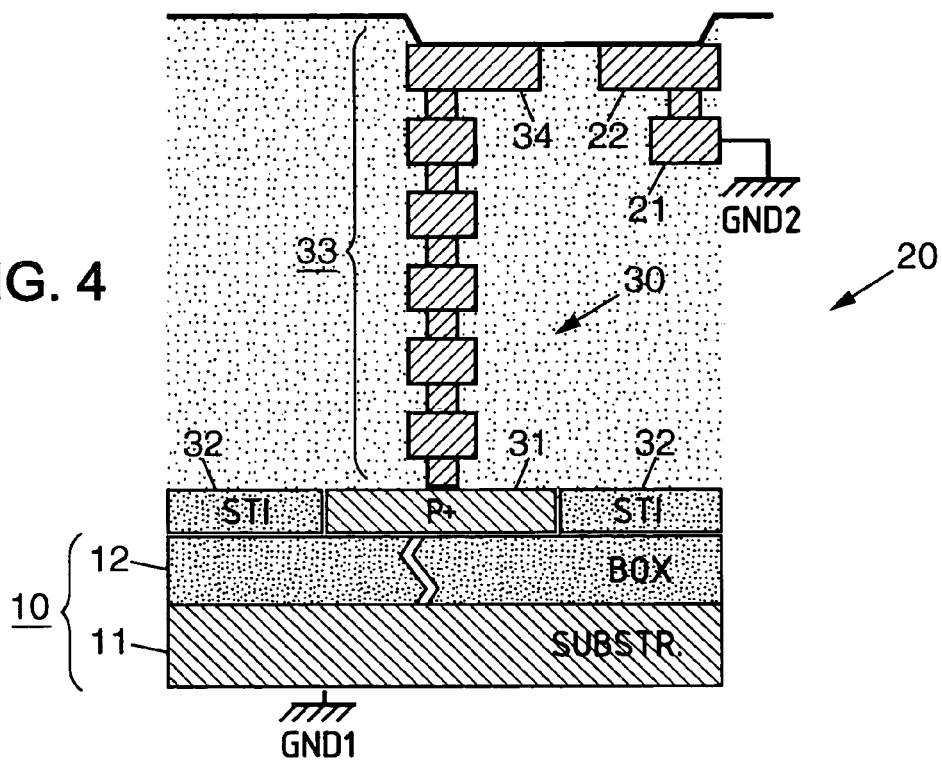
FIG. 4 is a partial sectional view of the semiconductor device after the entire thickness of the passivation layer has been removed over and between the metal lines.

When the entire thickness of the passivation layer has been removed, the structure illustrated in FIG. 4 is obtained.

Figure 5:
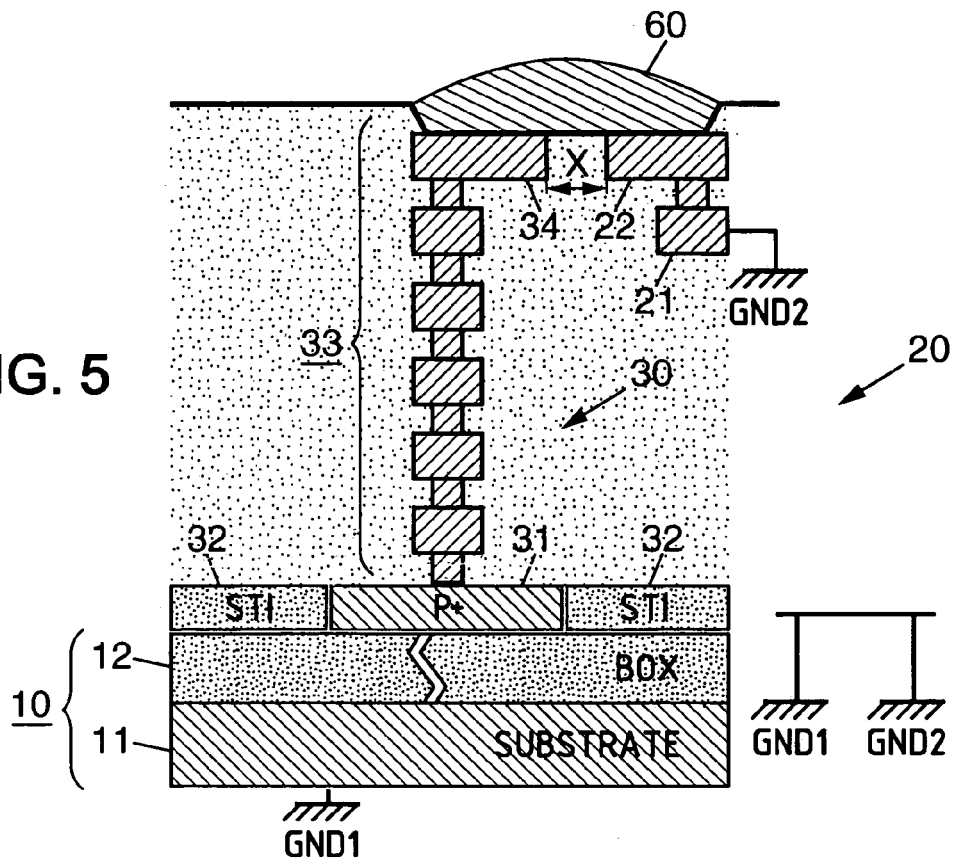
FIG. 5 is a partial sectional view of the semiconductor device illustrating a metal bridge interconnecting the exposed metal lines.

In the next step, an interconnect is produced between the metal lines 34 and 22 by depositing a metal bridge, for example made of platinum (or else aluminium, tungsten, copper, etc.) between the exposed parts of these two lines. The configuration shown in FIG. 5 is thus obtained.

Thus, the ground GND1 of the substrate 10 is electrically connected to the ground GND2 of the device 20. This electrical connection is illustrated schematically in the bottom right-hand side of FIG. 5. It is then no longer possible stricto sensu to state that the structure 30 is isolated from the rest of the circuit 20.

This deposition step may be carried out, for example, by CVD (Chemical Vapour Deposition). However, it is preferable for it to be carried out by a suitable FIB treatment, since the wafer is already positioned in the FIB machine. Preferably, the distance X along a line parallel to the surface of the substrate, between the exposed parts of the line 22 and 34, does not exceed 5 µm. In this way, the amount of metal to be deposited is limited.

Since the metal bridge 60 is present, it is possible to carry out the step (not shown) of treating the device 20 by FIB according to the requirements of the application. During this treatment, the ions can flow away to the ground GND1 of the substrate through the metal bridge 60 and the bias path for the substrate 10 that includes the structure 30, instead of building up within the ground GND2 of the device 20. Thus, any risk or destroying or damaging the device 20 is avoided.

Preferably, the method is completed by a step of breaking the electrical connection between the lines 22 and 34. This step makes it possible to reestablish the isolation of the rest of the device 20 relative to the layer 11 of the substrate. Without this step, the advantage of using an SOI substrate would be lost.

Figure 6:
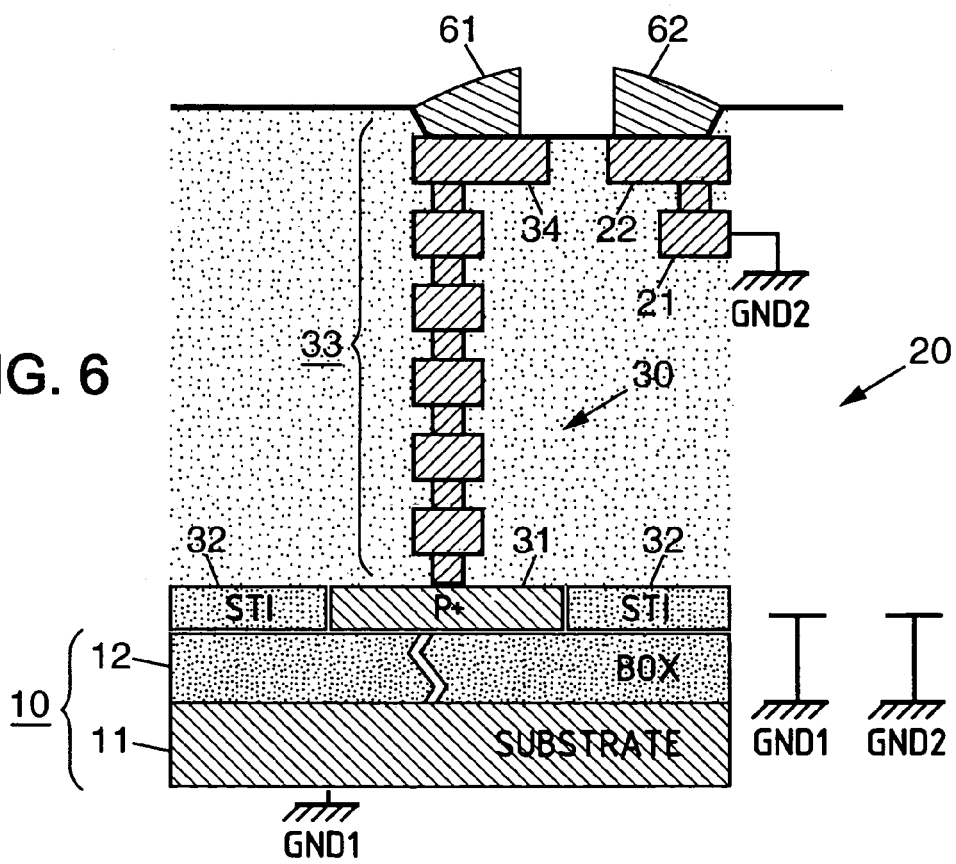
FIG. 6 is a partial sectional view of the semiconductor device illustrating a break in the metal bridge, the break thereby producing two contacts electrically isolated from each other.

This break is obtained by removing at least part of the metal bridge 60 so that there now remains only two contacts 61 and 62 on top of the metal line 34 and the metal line 22 respectively, these contacts being electrically isolated from each other, so as to obtain the structure shown in FIG. 6. This removal may be obtained by a further FIB treatment through a suitable mask. Of course, it is also possible to remove all of the conducting bridge 60 so as to return to the structure of FIG. 4.

Breaking the electrical connection between the metal lines 34 and 22 reestablishes the separation of the ground GND1 of the substrate 10 from the ground GND2 of the device 20.

This separation is illustrated schematically in the bottom right-hand side of FIG. 6. In this way, the structure 30 may once again be said to be isolated from the rest of the structure 20.

The invention has been described above in the case of a preferred, but non-limiting, embodiment. In particular, the steps of removing the passivation layer illustrated by FIGS. 1 and 3 and the step of opening the metal bridge 60 have advantageously been provided here in the form of an FIB treatment because the wafer is already positioned in the FIB machine. However, any other known removal process is conceivable, for example dry etching, wet etching, CMP (Chemical Mechanical Polishing), and more.

Although a specific embodiment of the invention has been disclosed, it will be understood by those having skill in the art that changes can be made to this specific embodiment without departing from the spirit and scope of the invention. The scope of the invention is not to be restricted, therefore, to the specific embodiment, and it is intended that the appended claims cover any and all such applications, modifications, and embodiments within the scope of the present invention.

What is claimed is:

1. A method of treating a semiconductor device with a focused ion beam, the device being produced on a surface of a silicon-on-insulator substrate, the method comprising:
   causing an insulator layer of a substrate which is part of a semiconductor device to break down by subjecting a second metal line to a focused ion beam until breakdown of the insulator layer occurs;
   wherein the insulator layer is located beneath an active zone of a semiconductor structure and wherein the insulator layer is electrically isolated from the rest of the semiconductor device; and
   wherein the active zone is electrically connected to the second metal line;
   forming an electrical connection between a first metal line and the second metal line, wherein the first metal line is electrically connected to an electrical ground of the semiconductor device;
   treating the semiconductor device with the focused ion beam; and
   breaking the electrical connection between the first metal line and the second metal line.

2. The method according to claim 1, wherein the causing an insulator layer of a substrate which is part of a semiconductor device to break down includes using the focused ion beam with a given polarity of ions, wherein the given polarity of ions is identical to a polarity of a doping for the active zone.

3. The method according to claim 2, wherein the forming an electrical connection between a first metal line and the second metal line includes forming the electrical connection by depositing a metal bridge between the first metal line and the second metal line by a focused ion beam treatment.

4. The method according to claim 3, wherein the breaking the electrical connection between the first metal line and the second metal line includes breaking the electrical connection by removing at least part of the metal bridge deposited by means of a suitable focused ion beam treatment.

5. The method according to claim 1, wherein the forming an electrical connection between a first metal line and the second metal line includes forming the electrical connection by depositing a metal bridge between the first metal line and the second metal line by a focused ion beam treatment.

6. The method according to claim 5, wherein the breaking the electrical connection between the first metal line and the second metal line includes breaking the electrical connection by removing at least part of the metal bridge deposited by means of a focused ion beam treatment.

7. The method according to claim 1, wherein, before the causing an insulator layer of a substrate which is part of a semiconductor device to break down, the second metal line is exposed by removing a passivation layer, by means of a focused ion beam treatment.

8. The method according to claim 7, wherein, before the forming an electrical connection between a first metal line and the second metal line, the first metal line is exposed by removing a passivation layer by means of a suitable focused ion beam treatment, through a mask having a depassivation window exposing the second exposed metal line.

9. A method of treating a semiconductor device with a focused ion beam, the device being produced on a surface of a silicon-on-insulator substrate, the method comprising:
   causing an insulator layer of a substrate which is part of a semiconductor device to break down by subjecting a second metal line to a focused ion beam until breakdown of the insulator layer occurs;
   wherein the insulator layer is located beneath an active zone of a semiconductor structure and wherein the insulator layer is electrically isolated from the rest of the semiconductor device; and
   wherein the active zone is electrically connected to the second metal line;
   forming an electrical connection between a first metal line and the second metal line by depositing a metal bridge therebetween, and wherein the first metal line is electrically connected to an electrical ground of the semiconductor device;
   treating the semiconductor device with the focused ion beam; and
   breaking the electrical connection between the first metal line and the second metal line by removing at least part of the metal bridge through use of a focused ion beam treatment.

10. The method according to claim 9, wherein the causing an insulator layer of a substrate which is part of a semiconductor device to break down includes using the focused ion beam with a given polarity of ions, wherein the given polarity of ions is identical to a polarity of a doping for the active zone.

11. The method according to claim 9, wherein, before the causing an insulator layer of a substrate which is part of a semiconductor device to break down, the second metal line is exposed by removing a passivation layer, by means of a focused ion beam treatment.

12. The method according to claim 11, wherein, before the forming an electrical connection between a first metal line and the second metal line, the first metal line is exposed by removing a passivation layer by means of a suitable focused ion beam treatment, through a mask having a depassivation window exposing the second exposed metal line.

* * * * *